(12) United States Patent
Peng et al.

(10) Patent No.: US 7,616,513 B1
(45) Date of Patent: Nov. 10, 2009

(54) MEMORY DEVICE, CURRENT SENSE AMPLIFIER, AND METHOD OF OPERATING THE SAME

(75) Inventors: Tao Peng, Nashua, NH (US); Greg J. Landry, Merrimack, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/262,412

(22) Filed: Oct. 28, 2005

Related U.S. Application Data

(60) Provisional application No. 60/623,525, filed on Oct. 29, 2004.

(51) Int. Cl.
G11C 7/02 (2006.01)
(52) U.S. Cl. .................. 365/207; 365/185.21; 365/205
(58) Field of Classification Search .................. 365/207
See application file for complete search history.

(56) References Cited

U.S. PATENT DOCUMENTS

| | | | |
|---|---|---|---|
| 4,397,003 A | | 8/1983 | Wilson et al. |
| 4,669,063 A | | 5/1987 | Kirsch |
| 5,029,137 A | | 7/1991 | Hoshi |
| 5,148,399 A | | 9/1992 | Cho et al. |
| 5,175,450 A | | 12/1992 | Chern |
| 5,327,379 A | | 7/1994 | Pascucci |
| 5,701,268 A | | 12/1997 | Lee et al. |
| 6,052,324 A | | 4/2000 | Tobita |
| 6,061,267 A | * | 5/2000 | Houston ..................... 365/154 |
| 6,067,256 A | * | 5/2000 | Yamashita et al. ..... 365/189.04 |
| 6,115,309 A | | 9/2000 | Coleman, Jr. |
| 6,314,028 B1 | | 11/2001 | Kono |
| 6,331,791 B1 | * | 12/2001 | Huang .......................... 326/98 |
| 6,396,310 B2 | * | 5/2002 | Shin ............................ 327/55 |
| 6,411,560 B1 | * | 6/2002 | Tanizaki et al. ............. 365/227 |
| 6,430,095 B1 | | 8/2002 | Casper |
| 6,449,202 B1 | | 9/2002 | Akatsu et al. |
| 6,501,696 B1 | | 12/2002 | Mnich et al. |

(Continued)

OTHER PUBLICATIONS

Sinha et al., "High-Performance and Low-Voltage Sense-Amplifier Techniques for sub-90nm SRAM," © 2003 IEEE, pp. 113-116.

(Continued)

Primary Examiner—Hoai V Ho
Assistant Examiner—Anthan T Tran

(57) ABSTRACT

A memory device, current sense amplifier and method of operating the same are disclosed herein. In accordance with one embodiment, the current sense amplifier circuit may include a pair of cross-coupled transistors, a pair of output nodes and a first pair of load transistors. The pair of cross-coupled transistors may be coupled for receiving a pair of differential currents and for generating a pair of differential voltages, which may then be supplied to the pair of output nodes. The first pair of load transistors may have mutually-connected gate terminals, mutually-connected drain terminals, and a source terminal coupled to a different one of the output nodes. In a unique aspect of the invention, an equalization transistor may coupled between the pair of output nodes for equalizing the pair of differential voltages for a predetermined amount of time at the beginning of a sense cycle. As such, the equalization transistor may be added to prevent the current sense amplifier circuit from generating erroneous results during the predetermined time period.

16 Claims, 4 Drawing Sheets

U.S. PATENT DOCUMENTS

| | | | |
|---|---|---|---|
| 6,671,201 | B2 | 12/2003 | Masuda |
| 6,829,171 | B2 | 12/2004 | Ooishi |
| 2002/0180491 | A1 | 12/2002 | Song et al. |
| 2003/0198112 | A1 | 10/2003 | Eleyan et al. |
| 2004/0120200 | A1 | 6/2004 | Gogl et al. |
| 2004/0179418 | A1* | 9/2004 | Hwang .................. 365/230.03 |
| 2005/0195672 | A1 | 9/2005 | Lee |

OTHER PUBLICATIONS

U.S. Appl. No. 10/870,289, filed Jun. 16, 2004.

USPTO Notice of Allowance for U.S. Appl. No. 0/870,289 dated Aug. 1, 2007; 4 pages.

USPTO Non-Final Rejection for U.S. Appl. No. 10/187,289 dated Feb. 21, 2007; 6 pages.

USPTO Non-Final Rejection for U.S. Appl. No. 10/870,289 dated Oct. 19, 2006; 7 pages.

USPTO Non-Final Rejection for U.S. Appl. No. 10/870,289 dated Jun. 8, 2006; 8 pages.

USPTO Non-Final Rejection for U.S. Appl. No. 10/870,269 dated Jan. 10, 2006; 8 pages.

USPTO Non-Final Rejection for U.S. Appl. No. 10/870,289 dated Aug. 1, 2005; 7 pages.

* cited by examiner

MEMORY DEVICE, CURRENT SENSE AMPLIFIER, AND METHOD OF OPERATING THE SAME

PRIORITY APPLICATION

The present application claims priority to Ser. No. 60/623,525 filed Oct. 29, 2004 entitled "Current Sense Amplifier (ISA) Circuit that is Mismatch Tolerant Over a Wide VCC Range" by Peng et al.

BACKGROUND OF THE INVENTION

1. Field of the Invention

This invention relates to electronic circuits and, more particularly, to current sense amplifier circuits used in semiconductor devices.

2. Description of the Related Art

The following descriptions and examples are given as background only.

Many modern semiconductor memories employ differential bit lines and some sort of differential amplifier or sensing circuit in their design. These differential amplifiers and sense circuits are commonly known as sense amplifiers (or "sense amps"). In addition to memory devices, sense amplifiers may be used in programmable arrays and many other applications. A wide variety of sense amps are known in the art, including current sensing and voltage sensing variations.

For example, dynamic random access memory (DRAM) devices usually employ voltage sense amplifiers (VSAs) for detecting the state of a DRAM memory cell. In voltage sensing, the bitline is precharged before the memory cell is activated. When the memory cell is activated, the memory cell charges or discharges the bitline to maintain or change the voltage of the bitline. However, the bitline may be quite long in some memory devices (e.g., large memory arrays), resulting in a large capacitive load for the memory cell. In some cases, the memory cell may not be able to provide enough cell current to quickly discharge or charge a large bitline, and an excessive amount of time may be needed to read the memory cells. Therefore, voltage sensing may not be the preferred sensing scheme in some memory devices (e.g., when operation speed is of concern).

For this reason, current sense amplifiers (ISAs) are widely used to measure signals in memory devices. Current sense amplifiers are well suited to measuring signals on heavily loaded capacitive lines, such as those found in memory devices or programmable array devices, where it would be slow to measure voltage. Located in a sense amplifier (SA) cell, the current sense amplifier measures a current and turns this into a small voltage difference output. In some cases, the output of a current sense amplifier may be passed to a voltage sense amplifier (VSA) also located in the sense amplifier cell, which amplifies the low voltage signal to a higher voltage signal. The output of the voltage sense amplifier may then be passed as the output of the sense amplifier cell.

FIG. 1 illustrates one embodiment of a current sense amplifier (ISA), which is located within a sense amp (SA) cell 150 for detecting a current differential between the complementary bitlines of a memory array (such as memory array 100). Once detected, the current differential is converted into a small voltage differential by ISA 130 and then supplied to voltage sense amplifier (VSA) 140, where it is amplified and output from the sense amp cell. In the embodiment shown, ISA 130 is coupled for receiving a pair of differential currents ($I_{BL}$, $I_{BLB}$) from one or more complementary bitlines (BL, BLB) of memory array 100. In some cases, ISA 130 may be coupled for receiving the pair of differential currents from only one column of memory cells (e.g., column 0 via COLMUX 110). In other cases, ISA 130 may be coupled for receiving the pair of differential currents from more than one column of memory cells (e.g., columns 0-N via COLMUX 110 to 120). The column multiplexers (COLMUX) are generally used to switch between the pairs of bitlines, depending on the column of memory cells selected.

FIG. 2 shows a conventional current sense amplifier design 200 with cross-coupled PMOS transistors (M1,M2), PMOS load transistors (M3,M4) and NMOS enable transistor (M8). When employed within a memory device, differential bitline currents ($I_{BL}$, $I_{BLB}$) may be supplied to the source terminals of cross-coupled transistors M1 and M2 during a read operation. To be "cross-coupled," the gate terminal of PMOS transistor M1 must be coupled to the drain terminal of PMOS transistor M2, and vice versa. The drain terminals of cross-coupled transistors M1 and M2 may then be coupled to ground through load transistors M3, M4 and enable transistor M8. In this manner, ISA 200 may be configured for converting the pair of differential currents into a pair of differential voltages during times in which the sense amplifier is enabled (e.g., when an active enable signal is supplied to transistor M8). In some cases, the pair of differential voltages may be supplied to a voltage sense amplifier (not shown). If used, the VSA may amplify the differential voltages and use the amplified voltages to generate a single-ended sense amplifier output voltage.

In the circuit of FIG. 2, the memory cell current flows into the low impedance source nodes of the cross-coupled PMOS transistors (M1, M2), where the current is translated into voltage. The input impedance looking into the source nodes of transistors M1, M2 may be approximately equal to:

$$r_{in} = \frac{1 - r_{o\_M3/4} gm_{M1/2}}{gm_{M1/2}} \qquad \text{EQ. 1}$$

where $r_{o\_M3/4}$ is the output impedance of transistors M3, M4 and $gm_{M1/2}$ is the transconductance of transistors M1, M2. In most cases, transistors M1, M2 and M3, M4 are carefully sized to make $r_{o\_M3/4} gm_{M1/2}$ as close to one as possible so that the input impedance will be approximately equal to zero. A low input impedance usually enables the sense amp to detect the differential currents as soon as possible and to generate an output voltage as high as possible.

However, the conventional circuit shown in FIG. 2 has a number of disadvantages. First of all, even though transistors M1, M2 and M3, M4 are carefully sized, random process variations may prevent the transistor pairs from having identical characteristics. In one example, process variations may cause the threshold voltage of transistor M1 to be somewhat higher than the threshold voltage of transistor M2, or vice versa. In another example, process variation may cause the transconductance or saturation current to differ between devices M1 and M2. However, transistors M1 and M2 are not the only devices to suffer from mismatch—transistors M3/M4 and devices in the memory cell may suffer, as well. In some cases, transistor mismatch may cause the sense amplifier to detect the wrong voltage at the beginning of a sense cycle. For example, the differential currents initially supplied to the current sense amplifier may be relatively weak. During this time (i.e., at the start of a sense cycle), transistor mismatch may cause more current to flow in one leg of the sense amp than the other, thereby causing the sense amplifier output to "go in the wrong direction" until the differential currents are firmly established.

Another disadvantage of the conventional circuit of FIG. 2 is that the optimal size of the PMOS load transistors (M3 and M4) is a strong function of VCC for speed and stability. As such, it is often difficult to achieve high performance across a wide range of power supply voltages (VCC) with the same load. In addition to speed and stability concerns, the circuit performance tends to suffer (or even fail) at lower power supply voltages (e.g., about 1.2V and lower).

Therefore, it would be desirable to provide a current sense amplifier solution that remedies the disadvantages of conventional solutions. For example, an improved current sense amplifier would exhibit an improvement in mismatch tolerance, operational speed and stability over a wide range of power supply voltages, including power supply voltages lower than about 1.2V.

SUMMARY OF THE INVENTION

The following description of various embodiments of memory devices, current sense amplifiers and methods is not to be construed in any way as limiting the subject matter of the appended claims.

According to one embodiment, a current sense amplifier (ISA) circuit is provided herein for improving mismatch tolerance and increasing circuit stability and speed. In general, the current sense amplifier circuit may include a pair of cross-coupled transistors, a pair of output nodes and a first pair of load transistors. The pair of cross-coupled transistors may be coupled for receiving a pair of differential currents and for generating a pair of differential voltages, which may then be supplied to pair of output nodes. The first pair of load transistors may have mutually-connected gate terminals, mutually-connected drain terminals, and a source terminal coupled to a different one of the output nodes. In some cases, an enable transistor may be coupled between the mutually-connected drain terminals of the first pair of transistors and ground. The enable transistor may be configured for activating the current sense amplifier circuit upon receiving a sense enable signal at a gate terminal thereof.

In some cases, the source and body terminals of the first pair of load transistors may be coupled together to reduce a threshold voltage associated with the transistors. This allows the current sense amplifier to operate under low power supply conditions (e.g., down to about 0.7V, in some embodiments).

In some cases, a second pair of load transistors may be added to the current sense amplifier circuit. For example, each of the second pair of load transistors may be coupled in parallel to a different one of the first pair of load transistors, and in series between a different one of the output nodes and the enable transistor. In some cases, a digital control signal may be supplied to the gate terminals of the second pair of load transistors to increase circuit stability and/or speed. For example, the second pair of load transistors may be deactivated upon receiving a first logic value of the digital control signal to increase circuit stability at low power supply values (e.g., about 1.2V and below, in some embodiments). On the other hand, a second logic value of the digital control signal may be used to activate the second pair of load transistors to increase circuit speed at high power supply values (e.g., above 1.2V, in some embodiments).

In some cases, an equalization transistor may be added between the output nodes of the current sense amplifier circuit. When activated, the equalization transistor may be used for equalizing the pair of differential voltages for a predetermined amount of time at the beginning of a sense cycle. For example, a delay circuit may be added to the current sense amplifier for supplying a delayed version of the sense enable signal to a gate terminal of the equalization transistor. The delayed version of the sense enable signal may be used for deactivating the equalization transistor after the predetermined amount of time, so that the pair of differential voltages may be accurately represented at the pair of output nodes.

In general, the predetermined amount of time may begin once the current sense amplifier is activated and may end once the equalization transistor is deactivated. In some cases, the predetermined amount of time may be based on an amount of fabrication-related mismatch between corresponding transistors within differential portions of the current sense amplifier circuit. Equalizing the differential voltages during this time period allows current to fully develop within the ISA before the true voltage differential is output for amplification. In other words, equalization may be used to prevent the "double switching" that often occurs at the beginning of a sense cycle (due to transistor mismatch) by preventing the ISA from generating erroneous results during the predetermined time period.

According to another embodiment, a memory device comprising a plurality of memory cells, arranged in a plurality of rows and columns, and a current sense amplifier is provided herein. In most cases, the current sense amplifier may be similar to the embodiment described above, including all improvements/advantages described herein. In some cases, a voltage sense amplifier may be coupled to the current sense amplifier for receiving the pair of differential voltages and for generating a single-ended output voltage therefrom.

According to yet another embodiment, a method for operating a current sense amplifier circuit is provided herein. For example, the method may include: supplying a pair of differential currents to input nodes of the current sense amplifier circuit, generating a pair of differential voltages from the differential currents, and supplying the results to output nodes of the current sense amplifier circuit.

In one preferred aspect of the invention, the method may include equalizing the pair of differential voltages during an initial time period at the beginning of a sense cycle to prevent the current sense amplifier circuit from generating erroneous results during the initial time period. As noted above, the initial time period may be based on an amount of fabrication-related mismatch between corresponding transistors within differential portions of the current sense amplifier circuit. In one example, the initial time period may be selected from a range comprising about 0 picoseconds to about 100 picoseconds. However, time periods outside of this range may be appropriate in alternative embodiments of the invention.

In another preferred aspect of the invention, the method may include activating or deactivating a pair of configurable load transistors of the current sense amplifier. In some cases, the method may include deactivating the pair of configurable load transistors to increase circuit stability under low power supply voltage conditions. In other cases, the method may include activating the pair of configurable load transistors to increase circuit speed under high power supply voltage conditions. In some embodiments, "low" power supply voltage conditions may include those less than or equal to about 1.2V, whereas "high" power supply voltage conditions may include those greater than about 1.2V. However, one skilled in the art would understand that the designation of "low" and "high" power supply voltages is technology dependent. Alternative designations may certainly apply in other embodiments of the invention.

BRIEF DESCRIPTION OF THE DRAWINGS

Other objects and advantages of the invention will become apparent upon reading the following detailed description and upon reference to the accompanying drawings in which.

Figure 1:
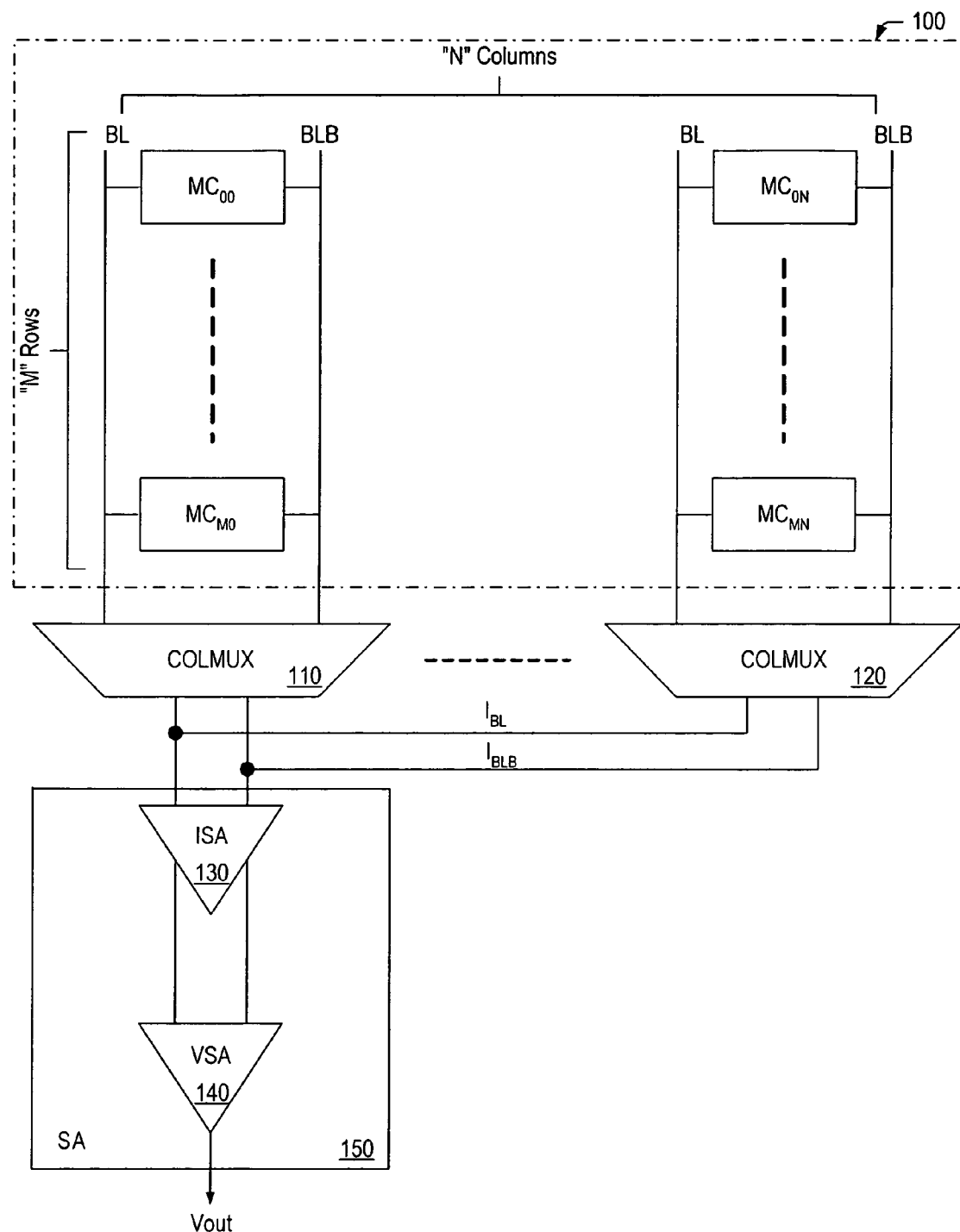
FIG. 1 is a block diagram illustrating a current sense amplifier (ISA) and voltage sense amplifier (VSA), each located in a sense amp cell (SA) used within a memory device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
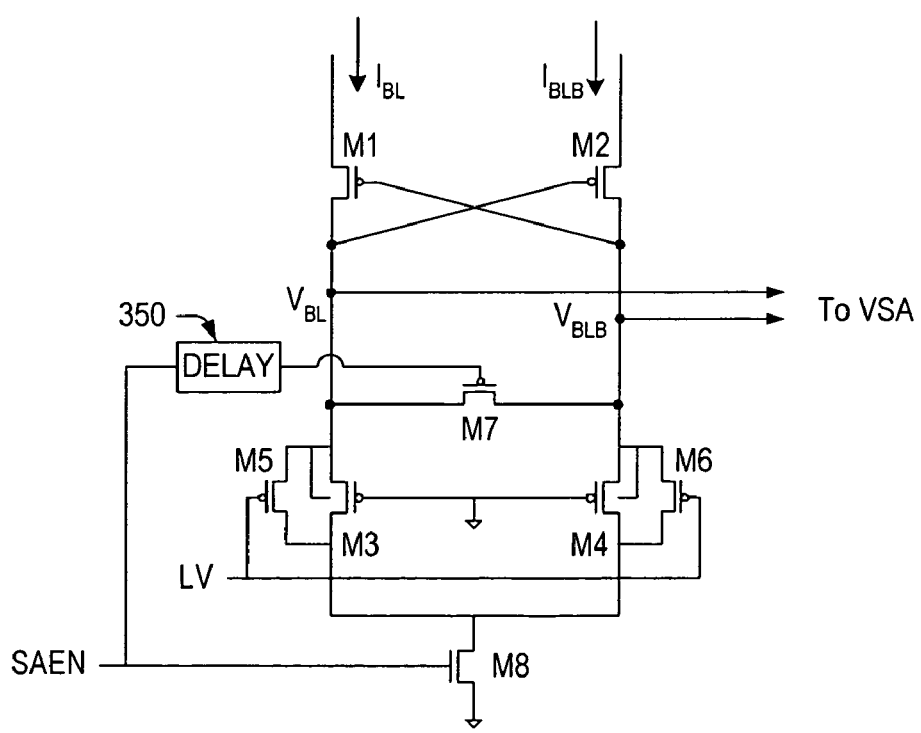
FIG. 3 is a circuit diagram illustrating one embodiment of an improved current sense amplifier design.

One embodiment of an improved current sense amplifier 300 is described and shown in FIG. 3. The improved current sense amplifier is well suited for use in a memory device, and in one preferred application, may be used within a high speed dual-port static RAM (SRAM) device. However, it is noted that the inventive concepts described herein are not limited to a particular memory device, and instead, may be applied to various types of memory (including, but not limited to, types of ROM, RAM, and FLASH memories), as well as other applications (such as programmable arrays).

As noted above, even symmetrical sense amp designs may suffer the effects of transistor mismatch during the initial stages of a sense cycle. Transistor mismatch becomes more of a problem as transistor sizes decrease and/or the size of memory arrays increase. For example, a typical memory device may exhibit up to +/−3 sigma (standard deviations) of transistor mismatch due, in part, to the high volume of memory cells and sense amp circuits within the memory device. As described in more detail below, the sense amp circuit described herein is capable of tolerating at least +/−3 sigma of mismatch between transistors located in both the memory cell and the sense amp. This prevents the sense amp circuit from "going in the wrong direction" and generating erroneous results at the beginning of a sense cycle. In addition, the improvements described herein also enable the current sense amplifier to achieve high speed and operational stability, even when operating under low voltage conditions. In one example, the current sense amplifier described herein may provide an address access time of about 8 ns (or less) when operating at about 1.08V and about 7 ns (or less) when operating at about 1.3V. Further advantages may become apparent in light of the description below.

The current sense amplifier shown in FIG. 3 is constructed using Complementary Metal Oxide Semiconductor (CMOS) technology, and therefore, will be described through the various interconnections that exist between the gate, source and drain terminals of the CMOS transistors. However, the inventive concepts described herein are not limited to CMOS, and may be applied to other process technologies, in other embodiments of the invention.

Like the previous embodiment, the improved current sense amplifier of FIG. 3 comprises a pair of cross-coupled PMOS transistors M1 and M2, a pair of PMOS load transistors M3 and M4 and an NMOS enable transistor M8. The gate terminal of transistor M1 is coupled to the drain terminal of transistor M2, while the gate terminal of transistor M2 is coupled to the drain terminal of transistor M1. For this reason, transistors M1 and M2 are said to be "cross-coupled." The source terminals of cross-coupled transistors M1 and M2 are coupled for receiving a differential input signal. When incorporated within a memory device, the source terminals of transistors M1 and M2 may be coupled for receiving a pair of differential currents ($I_{BL}$, $I_{BLB}$) from one or more complementary bitlines (BL,BLB) of a memory device (such as memory device 100 of FIG. 1). Other differential input signals may be supplied to transistors M1 and M2, in other embodiments of the invention.

The drain terminals of cross-coupled transistors M1 and M2 are also coupled to the source terminals of load transistors M3 and M4, respectively. The gate terminals of transistors M3 and M4 are coupled together (i.e., mutually-connected) and coupled to ground. The drain terminals of transistors M3 and M4 are also coupled together (i.e., mutually-connected) and coupled to the drain terminal of enable transistor M8. The drain-to-source path of transistor M8 is coupled between the source terminals of load transistors M3, M4 and ground. In this configuration, the current sense amplifier may be activated (i.e., turned-on) when an active sense amplifier enable (SAEN) signal is supplied to the gate terminal of transistor M8.

When the SAEN signal goes high, the current sense amplifier (ISA) is enabled, and cell current starts flowing into the source terminals of cross-coupled transistors M1 and M2. The differential currents ($I_{BL}$, $I_{BLB}$) are translated into a differential voltage ($V_{BL}$, $V_{BLB}$) by transistors M1, M2 and supplied to the output nodes of ISA 300. In some cases, the differential voltage may then be supplied to a second stage voltage sense amplifier (such as VSA 140 of FIG. 1) for further voltage amplification.

Figure 2:
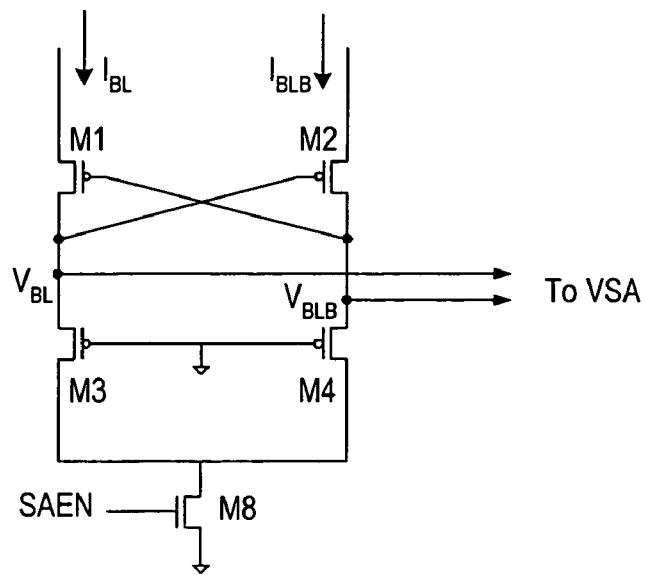
FIG. 2 is a circuit diagram of a conventional current sense amplifier design.

Current sense amplifier 300 provides many improvements over the configuration shown in FIG. 2. For example, current sense amplifier 300 includes an additional pair of PMOS load transistors M5 and M6. The additional pair of load transistors are each coupled in parallel to a different one of the first pair of load transistors (M3 and M4). For example, the source terminal of transistor M5 is coupled to the source terminal of transistor M3, and to the drain terminal of transistor M1. The drain terminal of transistor M5 is coupled to the drain terminal of transistor M3, and to the drain terminal of transistor M8. Transistor M6 is similarly coupled to transistors M2, M4 and M8 in the opposite current leg of ISA 300.

The additional pair of load transistors included within current sense amplifier 300 may be configurable for high speed and/or stability. For example, transistors M5 and M6 may be turned off under low voltage conditions (e.g., 1.2V and below) to increase circuit stability. On the other hand, transistors M5 and M6 may be turned on under high voltage conditions (e.g., above 1.2V) to increase speed. Note: the designation of "low" and "high" voltage conditions is technology dependent. Alternative designations may be used, when appropriate. In some embodiments of the invention, transistors M5/M6 may be implemented with NMOS, rather than PMOS transistors, and therefore, may be activated/deactivated under opposite voltage conditions. However, NMOS transistors may exhibit different process, temperature and voltage dependencies than that of PMOS transistors M1/M2. For this reason, it may be desirable to use the same type of FET (e.g., PMOS) for both transistor pairs (M1/M2 and M3/M4).

The activation/deactivation of transistors M5/M6 is accomplished by using a digital control signal (LV) that is held at a logic low value for high voltage operation and a logic high value for low voltage operation. In a preferred application for which this circuit is used, the value of the LV signal is set using a bond option; however, any other means to control the LV signal may be used including, but not limited to, programmable registers, volatile or non-volatile memory, including SRAM, DRAM, FLASH, EPROM, EEPROM, MRAM and magnetic storage memory.

Using a digital control signal allows specific configurations to be selected for specific requirements. For example, the digital control signal can be used to select between a high voltage range (in one example, about 1.3V-1.45V) and a low voltage range (in one example, about 1.08V-1.26V). As one advantage, the digital control signal provides a user selectable input at the package level. In addition, the digital control signal consumes less power and area than conventional solutions, which utilize a replica ISA circuit to auto-correct for process, voltage, and temperature variations.

In some cases, PMOS load devices M3 and M4 may suffer from body effects, if the source terminals are not connected to the well (or body terminals) of the devices. The disadvantage is that under low power supply voltage (VCC) conditions, the low level output voltage (VOL) may be limited to the absolute value of |VTP(Vsb)|, or in other words, the value of the transistor threshold voltage (VTP) when the source terminal is at a lower voltage than the body terminal. In some cases, the VOL may be bound by a threshold voltage, which is about 100 mV higher than if Vsb were equal to zero. Such an increase in transistor threshold voltage may reduce the output swing of the current sense amplifier, making it difficult to drive a second stage voltage sense amplifier.

For this reason, the source terminals of load devices M3 and M4 may be coupled to the body terminals in some embodiments of the invention to reduce the body effect, and thus, lower the output VOL. This is another improvement over the embodiment of FIG. 2. However, body biasing presents a trade-off between VOL and capacitance. For example, although a lower VOL may result in higher capacitance (and thus, slower speed), the resulting improvement in output swing may be preferred in most applications. In one embodiment, only one pair of load transistors (e.g., M3, M4) may have this body biasing configuration. In such an embodiment, the increase in speed resulting from this configuration may be approximately 200 ps over alternative embodiments in which body biasing is used within both pairs of PMOS load transistors (M3, M4 and M5, M6).

It is worth noting that body biasing may not be necessary in all embodiments of the invention. For instance, the output swing of ISA 300 is usually not an issue when higher power supply voltages are used. As such, there may be no need to extend the output swing by adding the extra capacitance provided by the body connection. However, body biasing may be desired under low power supply voltage conditions to obtain the additional output swing generally desired under such conditions.

Similar to the embodiment of FIG. 2, the transistor pairs M1/M2, M3/M4 and M5/M6 of ISA 300 are each carefully sized to ensure that the input impedance is as close to zero as possible. However, transistor mismatch and insufficient differential input current may still cause the current sense amplifier to go in the wrong direction. By tying the output nodes of ISA 300 together at the beginning of a sense cycle (i.e., after the SAEN signal goes high), ISA 300 may allow cell current to fully develop in the ISA, and thus, prevent the sense amp from initially switching in the wrong direction.

In order to accommodate transistor mismatch, a PMOS equalization transistor M7 is coupled between the output nodes of ISA 300 for equalizing the differential output voltages during an initial time period at the beginning of a sense cycle. The equalization transistor represents yet another improvement over the embodiment of FIG. 2. As shown in FIG. 3, the source-to-drain path of equalization transistor M7 is coupled between the drain terminals of cross-coupled transistors M1 and M2. In addition, the gate terminal of equalization transistor M7 is coupled to the output of a delay element 350, which is controlled by the sense amp enable (SAEN) signal.

As noted above, current sense amplifier 300 may be activated when the SAEN signal goes high. In addition to enable transistor M8, the active high SAEN signal is supplied to delay element 350, where it is delayed for a predetermined amount of time. In general, the predetermined amount of time may be based on an amount of fabrication-related mismatch between corresponding transistors within differential portions of the current sense amplifier circuit (e.g., mismatch between transistors M1/M2, M3/M4 and/or M5/M6). In one embodiment, the predetermined time period may be selected from a range comprising about 0 picoseconds to about 100 picoseconds. Regardless, delay element 350 may include any type of fixed or adjustable delay, one example of which is a combination of inverters.

Figure 4:
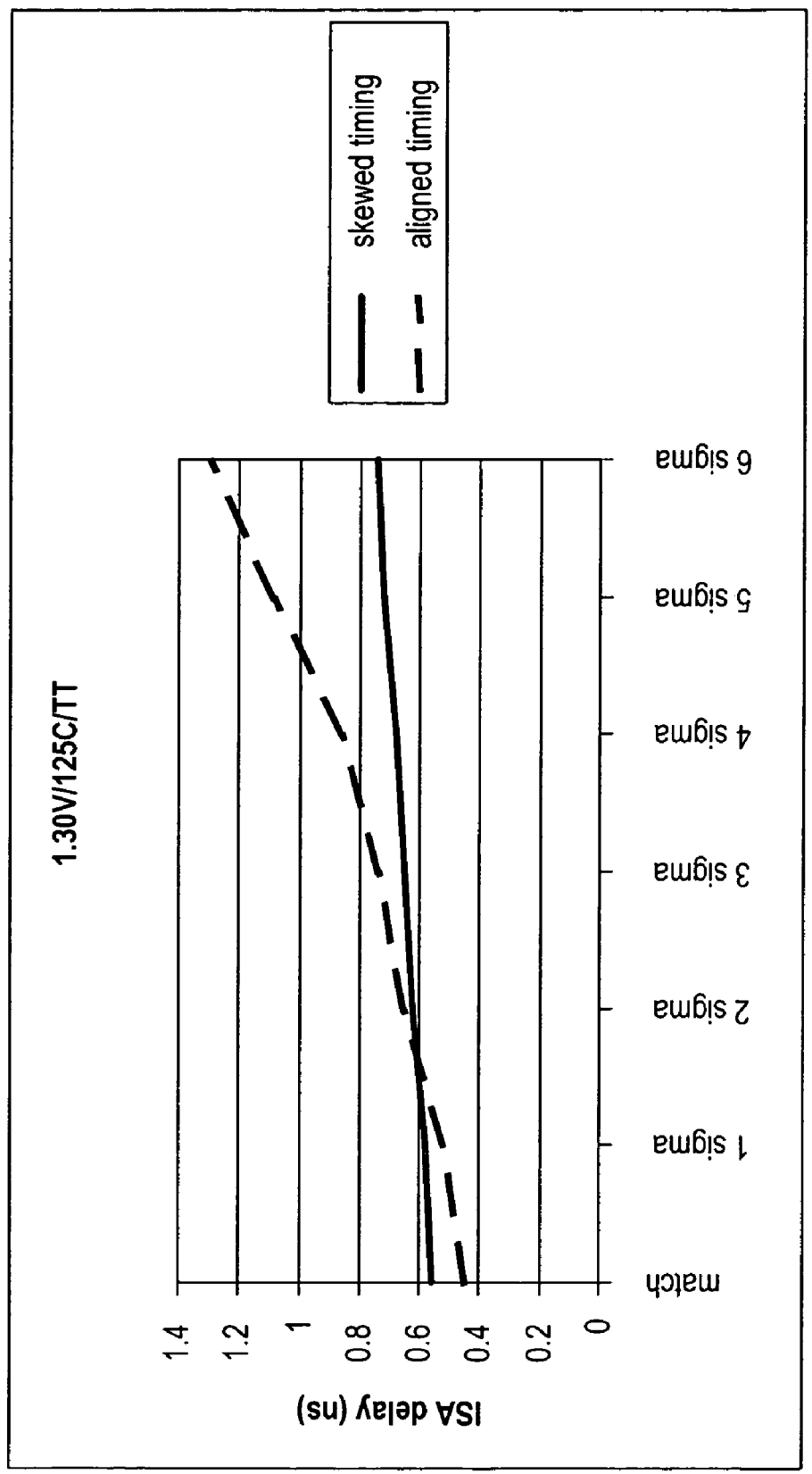
FIG. 4 is a graph illustrating the improved mismatch tolerance resulting from the improved current sense amplifier of FIG. 3.
Figure 5:
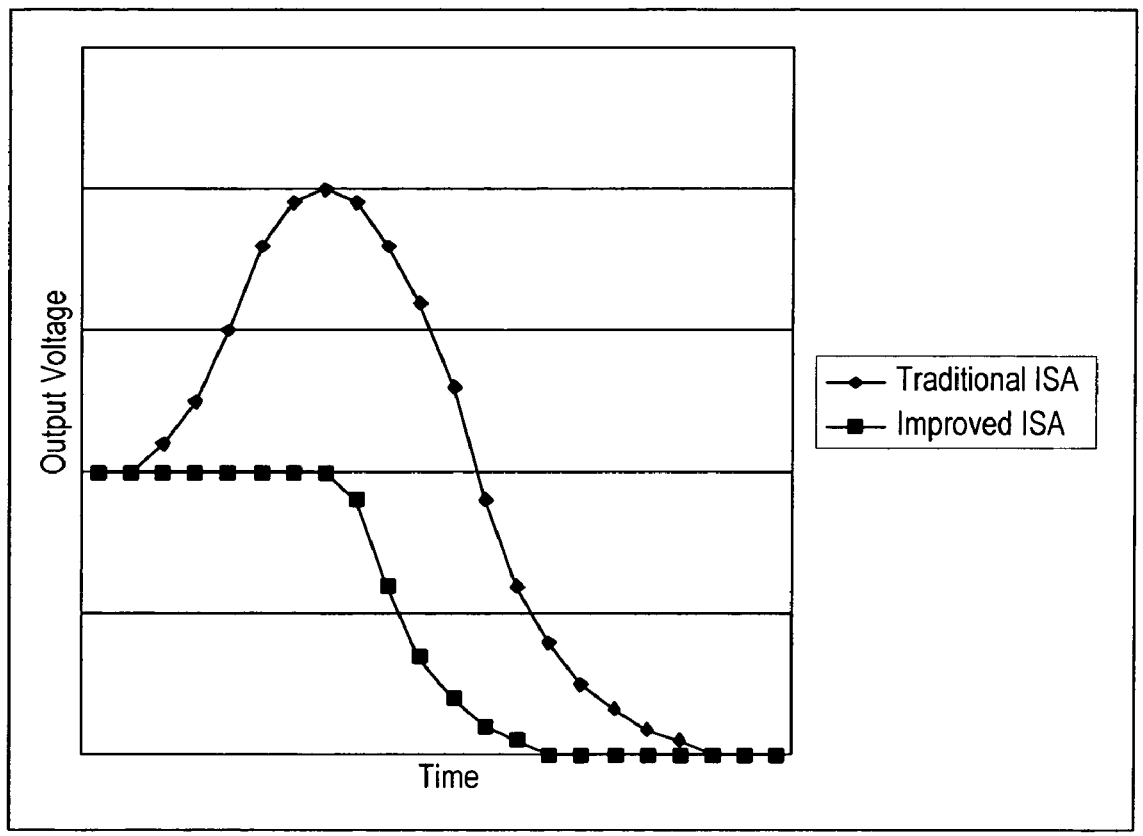
FIG. 5 is a graph illustrating the difference in ISA delay between the embodiments shown in FIGS. 2 and 3.

After the predetermined time period, delay element 350 supplies a delayed version of the SAEN signal to the gate terminal of equalization transistor M7 to deactivate this transistor, thereby allowing a true voltage differential to develop at the output nodes. By equalizing the differential voltages at the beginning of the sense cycle, the improved current sense amplifier allows current to be fully developed before amplification, thus, preventing the sense amp from producing erroneous results due to transistor mismatch. The improved mismatch tolerance of ISA 300 is shown in FIGS. 4 and 5. The dashed line in FIG. 4 shows how the ISA delay (i.e., the delay in achieving the correct result) increases with transistor mismatch, as would be the case in the embodiment of FIG. 2. The solid line shows much less increase in ISA delay when the equalization scheme of FIG. 3 is used, especially for mismatch values above 1.5 sigma.

The difference in ISA delay between the double-switching embodiment of FIG. 2 and the improved embodiment of FIG. 3 is illustrated in the graph of FIG. 5. As shown in FIG. 5, the ISA delay of the traditional ISA (FIG. 2) is significantly greater than that of the improved ISA (FIG. 3). In other words, ISA 200 provides significantly more delay by switching in the wrong direction (i.e., increasing in voltage) before recovering and switching into the appropriate direction (i.e., decreasing in voltage). This increase in delay increases the overall sense amp delay, thereby decreasing the overall speed of operation. Unlike ISA 200, ISA 300 of FIG. 3 overcomes the double-switching problem by adding an equalization transistor between the output nodes of the current sense amp circuit. The equalization transistor prevents double switching (and therefore, reduces the ISA delay) by equalizing the ISA output voltages during an initial time period at the beginning of a sense cycle (i.e., after the sense amp is enabled for sensing).

One embodiment of an improved current sense amplifier (ISA) with increased mismatch tolerance, circuit stability and operational speed has now been described. For example, mismatch tolerance may be greatly improved by adding an equalization transistor between the output nodes of the ISA. The equalization transistor is used for equalizing the differential output voltages for some period of time at the beginning of a sense cycle. A delay element is coupled to the equalization transistor for providing a fixed or adjustable amount of delay, which allows current to fully develop within the ISA before a true representation of the differential voltage is output for amplification. In addition, circuit stability and operational speed are improved by providing an additional pair of configurable load devices. A digital control signal is supplied to the configurable load devices for activating and deactivating the devices to increase circuit speed and stability. Furthermore, body biasing may be used within at least one pair of load devices to enable the improved ISA to operate at substantially lower supply voltages.

The inventive concepts described herein were applied to an 18 MB dual-port SRAM device produced by Cypress Semiconductor Corp. The invention enabled the dual-port SRAM to function down to about 0.7V and to achieve high speed (e.g., about 7 ns address access time) over a wide range of power supply voltages (e.g., about 1.08V to 1.45V). Alternative results may be obtained when the inventive concepts are applied to other memory devices or products.

For purposes of clarity, many of the details of the improved circuit and the methods of designing and manufacturing the same that are widely known and are not relevant to the present invention have been omitted from the description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A current sense amplifier circuit, comprising:
   a pair of cross-coupled transistors coupled for receiving a pair of differential currents on corresponding source terminals of the transistors, and for generating a pair of differential voltages on corresponding drain terminals of the transistors;
   a pair of output nodes coupled to the drain terminals of the pair of cross-coupled transistors for receiving the pair of differential voltages;
   an equalization transistor, whose source-drain path is coupled between the pair of output nodes for equalizing the pair of differential voltages for a predetermined amount of time at the beginning of a sense cycle;
   a first pair of load transistors having mutually-connected gate terminals, mutually-connected drain terminals, and a source terminal coupled to a different one of the output nodes; and
   a second pair of load transistors, each coupled in parallel to a different one of the first pair of load transistors between an enable transistor and a different one of the output nodes, wherein gate terminals of the second pair of load transistors are coupled for receiving a digital control signal, and wherein a logic value of the digital control signal is selected based on a level of a power supply voltage supplied to the current sense amplifier circuit, such that during a sense operation:
      a first logic value of the digital control signal is selected to deactivate the second pair of load transistors for increasing circuit stability when the level of the power supply voltage is low; and
      a second logic value of the digital control signal is selected to activate the second pair of load transistors for increasing circuit speed when the level of the power supply voltage is high.

2. The current sense amplifier circuit as recited in claim 1, wherein the source and body terminals of the first pair of load transistors are coupled together to reduce a threshold voltage associated with the transistors.

3. The current sense amplifier circuit as recited in claim 1, further comprising the enable transistor, which is coupled between the mutually-connected drain terminals of the first pair of transistors and ground, wherein the enable transistor is configured for activating the current sense amplifier circuit upon receiving a sense enable signal at a gate terminal thereof.

4. The current sense amplifier circuit as recited in claim 3, further comprising a delay circuit coupled for supplying a delayed version of the sense enable signal to a gate terminal of the equalization transistor.

5. The current sense amplifier circuit as recited in claim 4, wherein the delayed version of the sense enable signal is configured for deactivating the equalization transistor after the predetermined amount of time, so that the pair of differential voltages are accurately represented at the pair of output nodes.

6. The current sense amplifier circuit as recited in claim 5, wherein the predetermined amount of time begins once the current sense amplifier is activated and ends once the equalization transistor is deactivated.

7. A memory device, comprising:
   a plurality of memory cells arranged in a plurality of rows and columns;
   a current sense amplifier coupled for receiving a pair of differential currents from at least some of the plurality of memory cells, wherein the current sense amplifier comprises:
      a pair of cross-coupled transistors coupled for receiving the pair of differential currents onto source terminals thereof and for generating a pair of differential voltages therefrom;
      a pair of output nodes coupled to the pair of cross-coupled transistors for receiving the pair of differential voltages;
      an equalization transistor coupled between the pair of output nodes for equalizing the pair of differential voltages during an initial time period at the beginning of a sense cycle;

a first pair of load transistors each coupled in series between a different one of the output nodes and ground, wherein source and body terminals of the first pair of load transistors are coupled together to reduce a transistor voltage threshold; and a second pair of load transistors, each coupled in parallel to a different one of the first pair of load transistors between a different one of the output nodes and ground, wherein gate terminals of the second pair of load transistors are coupled for receiving a digital control signal, and wherein a logic value of the digital control signal is selected based on a level of a power supply voltage supplied to the current sense amplifier circuit, such that during sense operations, the second pair of load transistors are (i) deactivated upon receiving a first logic value of the digital control signal during low power supply voltage conditions to increase current sense amplifier stability and (ii) activated upon receiving a second logic value of the digital control signal during high power supply voltage conditions to increase current sense amplifier speed.

8. The memory device as recited in claim 7, further comprising a voltage sense amplifier coupled for receiving the pair of differential voltages and configured for generating a single-ended output voltage therefrom.

9. A method for operating a current sense amplifier circuit, the method comprising:

supplying a pair of differential currents to input nodes of the current sense amplifier current;

generating a pair of differential voltages from the differential currents, and supplying the results to output nodes of the current sense amplifier circuit;

equalizing the pair of differential voltages during an initial time period at the beginning of a sense cycle to prevent the current sense amplifier from generating erroneous results during the initial time period;

coupling a source terminal of a first pair of load transistors to a first one of the output nodes;

coupling each of a second pair of load transistors in parallel to a different one of the first pair of load transistors between an enable transistor and a second one of the output nodes; and supplying a digital control signal to the second pair of load transistors included within the current sense amplifier circuit for controlling activation and deactivation of the load transistor during the sense cycle, wherein selection of the digital control signal is based on a level of a power supply voltage supplied to the current sense amplifier circuit, such that the second pair of load transistors are (i) deactivated upon receiving a first logic value of the digital control signal during low power supply voltage conditions to increase current sense amplifier stability and (ii) activated upon receiving a second logic value of the digital control signal during high power supply voltage conditions to increase current sense amplifier speed.

10. The method as recited in claim 9, wherein the initial time period is based on an amount of fabrication-related mismatch between corresponding transistors within differential portions of the current sense amplifier circuit.

11. The method as recited in claim 10, wherein the initial time period is selected from a range comprising about 0 picoseconds to about 100 picoseconds.

12. The method as recited in claim 9, wherein the step of supplying the digital control signal comprises supplying a first digital control signal for deactivating the pair of load transistors to increase circuit stability under low power supply voltage conditions.

13. The method as recited in claim 9, wherein the step of supplying the digital control signal comprises supplying a second digital control signal for activating the pair of load transistors to increase circuit speed under high power supply voltage conditions.

14. The method as recited in claim 13, wherein low power supply voltage conditions comprise those less than or equal to about 1.2V, and wherein high power supply voltage conditions comprise those greater than about 1.2V.

15. The memory device as recited in claim 7, further comprising a delay circuit coupled to a gate terminal of the equalization transistor for deactivating the equalization transistor after the initial time period.

16. The memory device as recited in claim 7, wherein the digital control signal is selected by a user of the memory device by using a bond option, a programmable register, a volatile memory element or a non-volatile memory element, which is included within the memory device for setting or storing a desired logic value of the digital control signal.

* * * * *